United States Patent [19]

Saigo et al.

[11] Patent Number: 4,897,561

[45] Date of Patent: Jan. 30, 1990

[54] APPARATUS FOR AND METHOD OF DISCRIMINATING SIGNALS

[75] Inventors: Akira Saigo, Chiba; Shigenari Maezawa, Kashiwa; Tomoaki Kageyama, Yamaguchi; Keizaburo Ishikura, Yamaguchi; Akio Sera, Yamaguchi; Junji Suehiro, Otake, all of Japan

[73] Assignee: Mitsui Petrochemical Industries, Ltd., Tokyo, Japan

[21] Appl. No.: 228,579

[22] Filed: Aug. 5, 1988

[30] Foreign Application Priority Data

Aug. 7, 1987 [JP] Japan ................................ 62-197811
Feb. 12, 1988 [JP] Japan ................................ 63-30490
Feb. 29, 1988 [JP] Japan ................................ 63-47212

[51] Int. Cl.[4] ................................ H03K 17/82
[52] U.S. Cl. ................................ 307/413
[58] Field of Search ............... 307/413, 231, 510, 522; 329/104, 110

[56] References Cited

U.S. PATENT DOCUMENTS 2,838,688 6/1958 Loewe ................................ 307/413
2,966,595 12/1960 Williams ................................ 307/413
3,104,373 9/1963 Salihi ................................ 307/413 X
3,183,498 5/1965 Midis et al. ..................... 307/413 X

*Primary Examiner*—William M. Shoop, Jr.
*Assistant Examiner*—Sharon D. Logan
*Attorney, Agent, or Firm*—Sherman and Shalloway

[57] ABSTRACT

A signal discriminator adapted to discriminate a signal with a specific frequency out of a current composed of two or more superimposed components with different frequencies. One type of signal discriminator disclosed includes a first coil composed of a primary and a secondary winding wound with the same number of turns and in the same direction on a core whose magnetomotive force and magnetic flux density are roughly proportional to each other, a second coil composed of a primary and a secondary winding wound on a core whose magnetomotive force and magnetic flux density are roughly proportional to each other, and an impedance circuit. Another type of signal discriminator is composed of a first winding with short-circuited ends and a second winding for detecting signals both wound on an annular core having an approximately linear BH characteristic with the magnetomotive force and the magnetic flux density roughly proportional to each other. Also disclosed is a method of obtaining the high frequency component of the signals transmitted through a signal line which is passed through said annular core.

5 Claims, 8 Drawing Sheets

600
601
SIGNAL WAVE INPUT CIRCUIT
602
DOMINANT WAVE INPUT CIRCUIT
603
AMPLIFIER
604
AMPLIFIER
605
PHASE COMPARATOR
606
OUTPUT CIRCUIT
511
512
513
514
503
504
202
200
500
100
103
502
501
505
C
$i_1 = i_H + i_L$
$i_1$

APPARATUS FOR AND METHOD OF DISCRIMINATING SIGNALS

BACKGROUND OF THE INVENTION

This invention relates to a device for and a method of discriminating a signal with a specific frequency out of a current composed of two or more superimposed current components havińg different frequencies.

A conventional device generally used for obtaining the signal of a current component to be detected out of a current which is composed of two or more current components with different frequencies employs a transformer or a shunt as the pickup and, in the after stage, a frequency filter circuit or the like.

In the above-described conventional signal discriminator, the signals which have passed the transformer or the shunt can contain besides the signal components noise components, so that a satisfactory S/N (signal to noise) ratio is not to be expected. Therefore, it is necessary for the frequency filter provided in the after stage to be highly efficient.

This naturally results in a relatively large apparatus, which also leads to high cost. Further, when a shunt is employed, a sufficient electrical isolation cannot be effected between the circuit from which signals are to be detected and the pickup. Accordingly, the apparatus is limited in its scope of application. It is difficult, for example, to apply it to a high-tension circuit.

SUMMARY OF THE INVENTION

It is accordingly an object of this invention to provide a signal discriminator of a relatively small size which provides a satisfactory S/N ratio and which makes it possible to effect a sufficient electrical isolation between the pickup and the circuit from which signals are to be detected such as a power cable.

(I) In accordance with this invention, there is first provided a signal discriminator, comprising:

a first coil composed of first and second primary windings wound with the same number of turns and in the same direction, each of said primary windings having a winding start terminal and a winding end terminal, and a secondary winding, said first and second primary windings and secondary winding being provided on a core whose magnetomotive force and magnetic flux density are roughly proportional to each other;

a second coil composed of a primary winding having terminals and a secondary winding having terminals wound on a core whose magnetomotive force and magnetic flux density are roughly proportional to each other; and an impedance circuit;

the terminals of the primary winding in the second coil being respectively connected to the winding end terminal of the first primary winding and the second winding end terminal of the second primary winding in the first coil, the impedance circuit being connected to the winding end terminal of the first primary winding the winding start terminal of the second primary winding in the first coil 1, detection signals with discriminated frequencies being obtained respectively from the terminals of the secondary winding in the first coil and the terminals of the secondary winding in the second coil when an electric current composed of more than two superimposed current components with different frequencies flows between the winding start terminal of the primary winding 11 and the winding start terminal of the primary winding in the first coil.

(II) Secondly, there is provided a signal discriminator composed of a first winding with short-circuited ends and a second winding for detecting signals, said first and second windings and being wound on an annular core 31 having an approximately linear BH characteristic, its magnetomotive force and magnetic flux density being roughly proportional to each other, as well as a high magnetic permeability which is approximately constant from the low frequency region to the high frequency region. Further, there is provided a method of obtaining the high frequency component of the signals transmitted through a signal line which is passed through said annular core.

BRIEF DESCRIPTION OF THE DRAWINGS

FIG. 2-1 is a diagram illustrating the operation of discriminating between the low frequency current component $i_L$ and the high frequency current component $i_H$ in a principal circuit current $i_1$;

FIG. 2—2 is a diagram illustrating the relation between the change with time of the principal circuit current $i_1$, that of a detection signal voltage $e_L$ due to the low frequency current $i_L$ and that of a detection signal voltage $e_H$ due to the high frequency current $i_H$;

DESCRIPTION OF THE PREFERRED EMBODIMENTS

Figure 1:
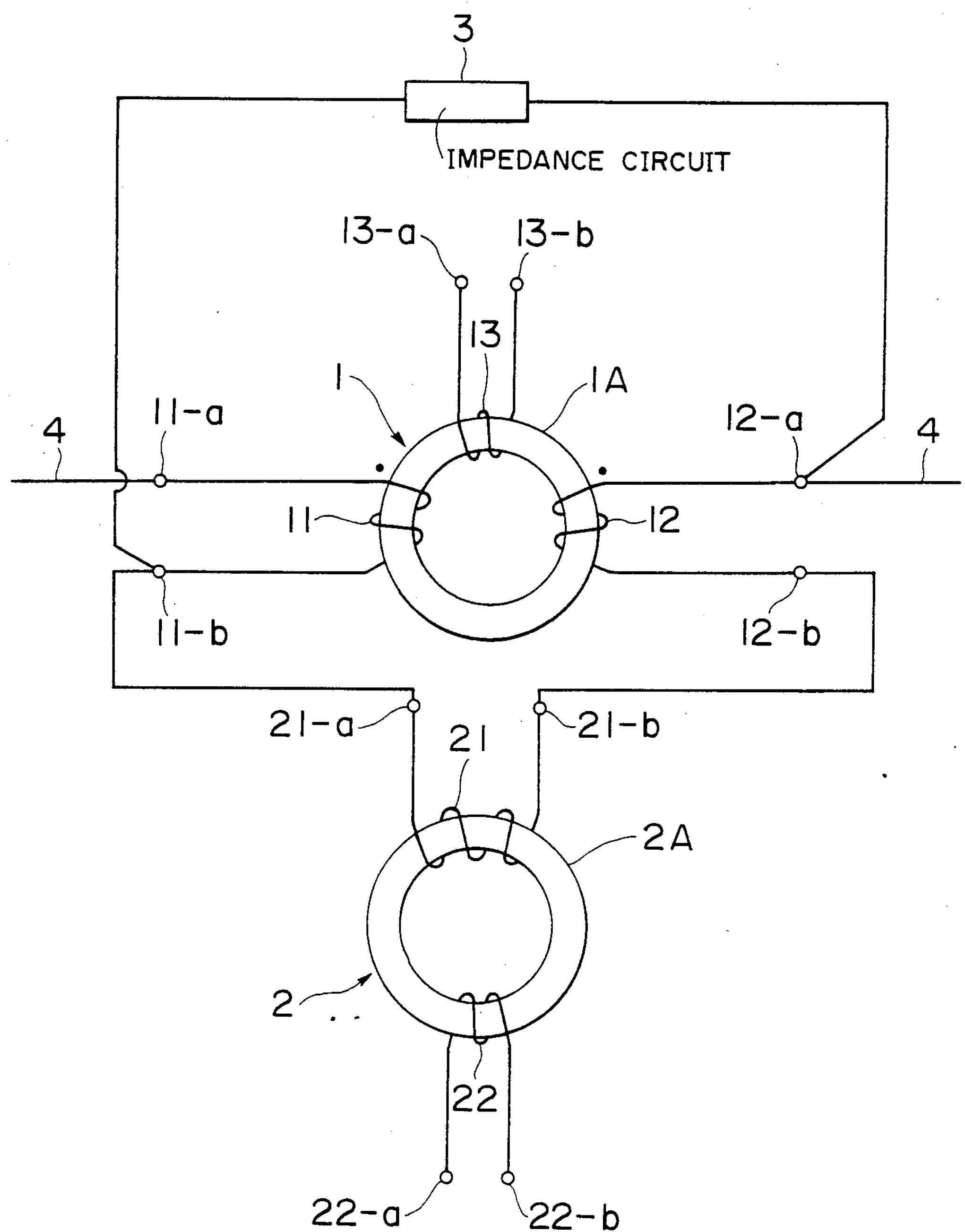
FIG. 1 is a schematic diagram illustrating the principle of the signal discriminator in accordance with a first embodiment of the present invention.

FIG. 1 illustrates the principle of a signal discriminator in accordance with the first embodiment of the present invention.

This signal discriminator includes coils 1 and 2 equipped with cores 1A and 2A, respectively. These cores 1A and 2A have a high magnetic permeability which is approximately constant from the low frequency region to the high frequency region. Further, their residual magnetism and coercive force are both small, and their magnetic characteristic is such as can be represented by an approximately linear B-H curve.

The signal discriminator further includes an impedance circuit 3 compose of capacitors, resistors, reactors, semiconductor elements, etc., arranged individually or in combination.

A principal circuit for passing the current from which signals are to be discriminated is shown at 4.

The coil 1 includes primary windings 11 and 12 wound on the core 1A, with the same number of turns and in the same direction.

The coil 1 further includes a secondary winding 13.

The coil 2 includes a primary winding 21 and a secondary winding 22.

The primary winding 11 of the coil 1 has a winding start terminal 11-*a* and a winding end terminal 11-*b*.

The primary winding 12 of the coil 1 has a winding start terminal 12-*a* and a winding end terminal 12-*b*.

The primary winding 21 of the coil 2 has terminals 21-*a* and 21-*b*.

The secondary winding 22 of the coil 2 has terminals 2-*a* and 22-*b*.

The terminals 11-*b* and 12-*b* are connected to the terminals 21-*a* and 21-*b*, respectively, by means of a wiring, and the impedance circuit 3 is provided between the terminals 1-*b* and 12-*a*.

The terminals 11-*a* and 12-*a* are connected to the principal circuit 4, allowing the current from which signals are to be discriminated to flow through the pricipal circuit 4.

The signal discrimination output can be obtained at the terminals 13-*a* and 13-*b* of the secondary winding 13 in the coil 1 as well as at the terminals 22-*a* and 22-*b* of the secondary winding 22 in the coil 2. Either or both of these terminal groups may be employed according to the purpose.

When a current composed of two or more superimposed current components with different frequencies is passed through the principal circuit 4, the entire current of the principal circuit flows through the primary winding 11 of the coil 1, and a current corresponding to the vector difference between the entire current and the current which has passed through the impedance circuit 3 flows through the primary winding 12. This current flows in series through the primary winding 21 of the coil 2.

The magnetomotive force of the core 1A is then a vector composition of the magnetomotive force generated by the current in the primary winding 11 and that in the primary winding 12. The windings 11 and 12 are wound in the same direction and the current directions in the windings 11 and 12 are reverse to each other with respect to the start and end of winding, so that the magnetomotive force of the core 1A is the vector difference between the magnetomotive force generated by the current in the primary winding 11 and that generated by the current in the primary winding 12. In the secondary winding 13 of the coil 1, a voltage is generated by the change in magnetomotive force of the core 1A.

The magnetomotive force of the core 2A is generated by the current corresponding to the vector difference between the entire current in the principal circuit 4 and the current which passes through the impedance circuit 3, the change in this magnetomotive force generating a voltage in the secondary winding 22 of the coil 2.

Accordingly, it is possible to obtain the signal element superimposed on the principal circuit current at the secondary winding 13 of the coil 1 or the secondary winding 22 of the coil 2 as the discriminated voltage signal by appropriately selecting the magnetic circuit in terms of the size and configuration of the cores 1A and 2A, the number of windings in each coil, etc. and the impedance type of the impedance circuit 3, the characteristic constant, etc.

The first embodiment of the signal discriminator in accordance with the first embodiment of the present invention will now be described in more detail.

Figure 2:
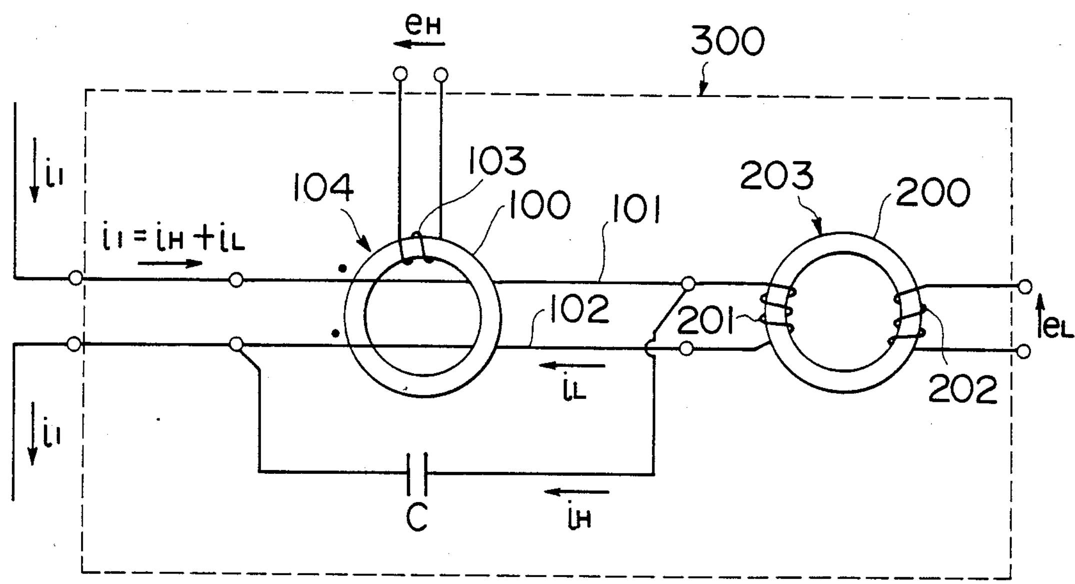
FIG. 2 is a schematic diagram showing the first embodiment of the signal discriminator in accordance with the present invention.
Figures 1, 2:
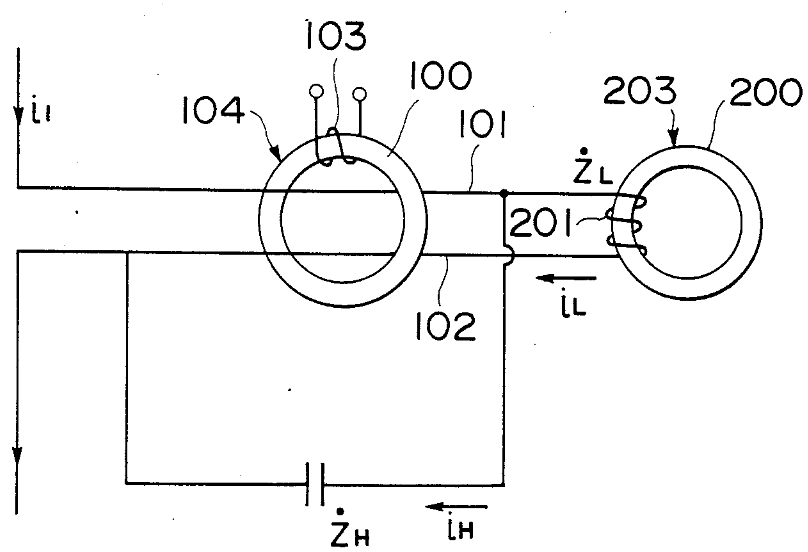
Figure 2:
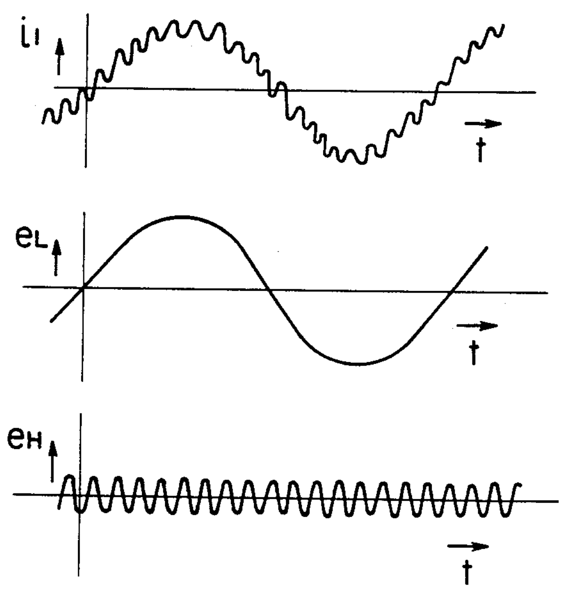

FIG. 2 shows the construction of a signal discriminator in accordance with the first embodiment of this invention. This signal discriminator includes cores 100 and 200 made of a cobalt based amorphous alloy. This alloy has a high magnetic permeability which is approximately constant from the low frequency region to the high frequency region as well as a linear hysteresis characteristic. As an example of such a material, the VATROVAC-6025F manufactured by Vacuumschmelze GmbH may be mentioned. Primary windings 101 and 102 pass through the core 100 in the same direction and by one turn, and a secondary winding 103 is provided, forming a coil 104. A primary winding 201 and a secondary winding 202 are provided on the core 200, forming a coil 203. A capacitor element forming an impedance circuit is shown at C. A magnetic shield box 300 adapted to prevent intrusion of noise signals from outside is shown at 300.

Suppose the principal circuit current $i_1$ is composed of a low frequency current $i_L$ and a high frequency current $i_H$, one superimposed on the other, the principal circuit current $i_1$ flows through the primary winding 101 of the coil 104. The primary winding 201 of the coil 203 has a high inductive reactance to a high frequency current and a low inductive reactance to a low frequency current. The capacitor C has a high capacitive reactance to a low frequency current. As a result, the high frequency current $i_H$ flows through the capacitor C, and the low frequency current $i_L$ flows through the primary winding 102 of the coil 104 by way of the first winding 201 of the coil 203.

Consequently, the element of the magnetomotive force of the core 100 which is due to the low frequency current $i_L$ is cancelled, leaving only the element which is due to the high frequency current $i_H$, so that the signal voltage $e_H$ due to the high frequency current $i_H$ can be obtained at the secondary winding 103 of the coil 104.

Similarly, the signal voltage $e_L$ which is due to the low frequency current $i_L$ can be obtained at the secondary winding 202 of the coil 203. The operation of discriminating the low frequency current element $i_L$ and the high frequency current element $i_H$ out of the principal circuit current $i_1$ will now be mathematically described with reference to FIG. 2-1. Suppose the principal circuit current $i_1$ is to be represented as $$i_1 = I_o \sin(2\pi ft + \phi_o) + I_n \sin(2\pi f_n t + \phi_n)$$

and the impedance of the primary winding 201 of the coil 203 is $\dot{Z}_L$ when the frequency is f, and $Z_{Ln}$ when the frequency is $f_n$, and the circuit impedance of the capacitor C is $Z_H$ when the frequency is f, and $Z_{Hn}$ when the frequency is $f_n$, $$\begin{aligned} i_L &= \{Z_H/(Z_H+Z_L)\}\cdot I_o\cdot\sin(2\pi ft+\phi_{o1}) + \\ &\quad \{Z_{Hn}/(Z_{Hn}+Z_{Ln})\cdot I_n\cdot\sin(2\pi f_n t+\phi_{o1}) \\ &= i_{Lf}+i_{Lfn} \end{aligned} \quad (1)$$

$$\begin{aligned} i_H &= \{Z_L/(Z_H+Z_L)\}\cdot I_o\cdot\sin(2\pi ft+\phi_{o1}) + \\ &\quad \{Z_{Ln}/(Z_{Hn}+Z_{Ln})\}\cdot I_n\cdot\sin(2\pi f_n t+\phi_{n1}) \\ &= i_{Hf}+i_{Hfn} \end{aligned} \quad (2)$$

In order to attain the condition: $i_{Lf}=I_o\sin(2\pi ft+\phi_{ol})$ when the frequency is f, the condition:

$$(|\dot{Z}_L/\dot{Z}_H|) << 1 \quad (3)$$

may be obtained from (1).

The gain $G_{100}$ of the voltage element generated at the winding 103 of the coil 104 which is caused by $i_H$. From equation (3), $$|\dot{Z}_H| >> |\dot{Z}_L|$$

Accordingly, the $i_{Hf}$ component has no influence, leaving the $i_{Hfn}$ component only, so that the following condition is obtained from (2):

$$G_{100}\alpha i_H = i_{Hfn}\alpha|\dot{Z}_{Ln}|/(|\dot{Z}_{Hn}+\dot{Z}_{Ln}|) \quad (4)$$

Suppose the ideal inductance is to be represented by $Z_L$ and $Z_{Ln}$ and the ideal electrostatic capacity C by $Z_H$ and $Z_{Hn}$, $$(|\dot{Z}_L/\dot{Z}_H|) = 4\pi^2 LC.f^2$$

$$(|\dot{Z}_{Hn}/\dot{Z}_{Ln}|) = 1/(4\pi^2 LC.f_n^2)$$

Suppose $f_n/f=n$, $$(|\dot{Z}_L/\dot{Z}_H|) = 4\pi^2 LC.f^2$$

$$(|Z_{Hn}/Z_{Ln}|) = 1/(4\pi^2 LC.f^2.n^2)$$

If, for example, it is so arranged that when $n=10^3$ and the frequency is f, $(|Z_L/Z_H|)=10^{-5}$, $$(|\dot{Z}_{Hn}/\dot{Z}_{Ln}|) = 1/10 \quad (5)$$

Further, $$(\phi_o-\phi_{ol}) = \text{angle } (\dot{Z}_L)/(\dot{Z}_H+\dot{Z}_L) = 0 \text{ (rad.)} \quad (6)$$

The formula (6) shows that the magnetomotive forces generated by the current component with the frequency f cancel each other in the core 100.

The formula (5) shows that the magnetomotive force of the $f_n$-component in the core 100 hardly ever decreases.

Accordingly, it is possible in this case to reduce the f-component gain to ca. 100 dB without decreasing the $f_n$-component gain.

When it is so arranged that $(|Z_L/\dot{Z}_H|)=10^{-6}$, the condition of $Z_{LN}-=\dot{Z}_{Hn}$, i.e. the resonance condition is obtained. Since $G_{100}$ extremely increases, the S/N ratio can be easily set to ca. 120 dB by a slight shifting from the resonance condition.

FIG. 2-2 shows a relation between the change with time of the principal circuit current $i_1$, that of the detection signal voltage $e_L$ due to the low frequency current $i_L$ and that of the detection signal voltage $e_H$ due to the high frequency current $i_H$.

Figure 3:
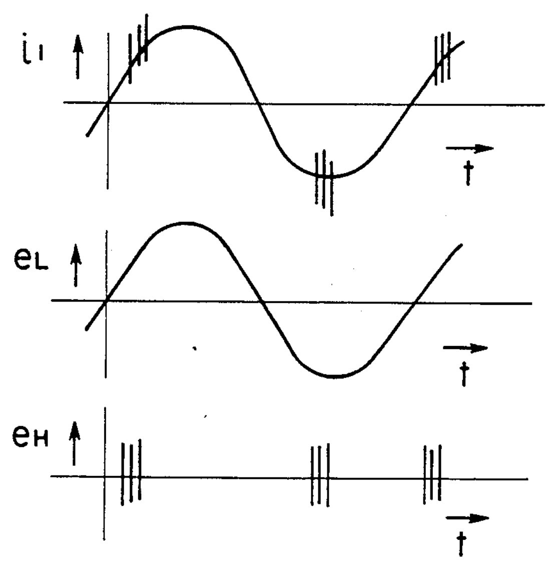
FIG. 3 is a diagram showing the result of signal discrimination by the construction shown in FIG. 2 when the principal circuit current $i_1$ is to be represented as a sine wave with a pulse superimposed thereon.

FIG. 3 shows the result of signal discrimination by the construction shown in FIG. 2 when the principal circuit current $i_1$ is to be shown as a sine wave with a pulse superimposed thereon.

Figure 4:
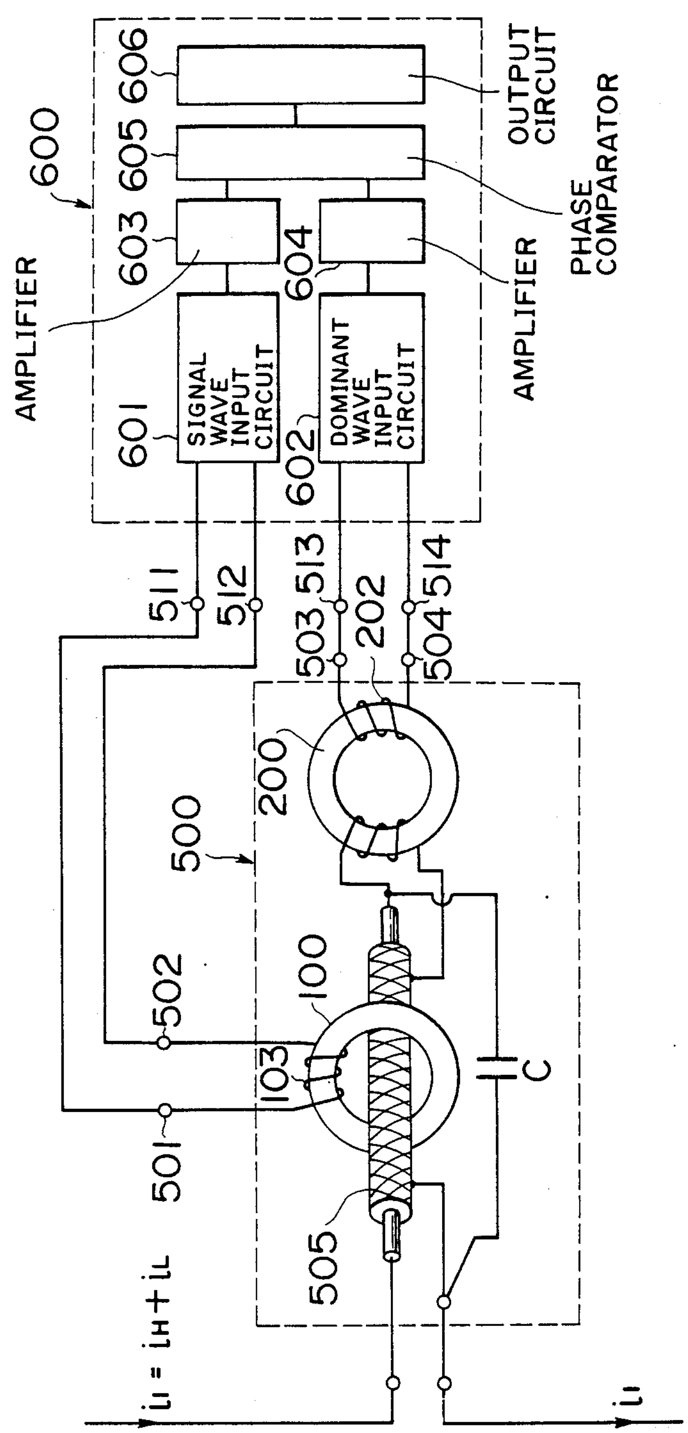
FIG. 4 is a diagram showing the construction in accordance with this embodiment as applied to a signal receiver for detecting signal elements out of a current in which a pulse signal or a high frequency signal is superimposed on the dominant wave.

FIG. 4 shows the above construction as applied to a signal receiver for detecting signal elements out of a current in which pulse signal or a high frequency signal is superimposed on the dominant wave. A signal discriminator in accordance with this invention is shown at 500, and a signal receiver at 600. The primary windings 101 and 102 in FIG. 2 are replaced by a coaxial cable 505. The signal receiver 600 includes a signal wave input circuit 601, a dominant wave input circuit 602, amplifiers 603 and 604, a phase comparator 605, and an output circuit 606.

When the dominant wave has a low frequency and the signal has a high frequency, the terminals 501–502 of the secondary winding 103 in the signal discriminator 500 are connected to the input terminals 511–512 of the signal wave input circuit in the signal receiver 600, and the terminals 503–504 of the secondary winding 202 are connected to the terminals 513–514 of the dominant wave input circuit. When, on the other hand, the dominant wave has a high frequency and the signal has a low frequency, the terminals 501–502 of the signal discriminator 500 are connected to the terminals 513–514 of the signal receiver 600, and the terminals 503–504 of the signal discriminator 500 are connected to the terminals 511–512 of the signal receiver 600. This apparatus can also be used as a receiver for multiplex frequency communication.

In order to detect with high fidelity the signal wave out of the principal circuit current $i_1$ in which the signal wave is superimposed on a specific phase of the dominant wave, the signal receiver 600 performs the following processing: it picks up the dominant wave and the signal wave generated respectively in the secondary windings 202 and 103, discriminated by the signal discriminator 500, through the dominant wave input circuit 602 and the signal input circuit 601. It then amplifies them by the amplifiers 604 and 603, respectively, and applies them to the phase comparator 605. The phase comparator performs continuous checking as to whether there exists the signal wave or not with respect to the specific phase of the dominant wave, outputting the result to the output circuit 606.

This arrangement enables noise signals from outside and the signal wave to be detected to be discriminated from each other, thereby making it possible to output exclusively the signal wave with high fidelity through the output circuit 606.

When the value of the principal circuit current is excessively large, threatening to cause magnetic saturation of the core 100 or 200, each core may be provided with a tertiary winding (not shown), with an appropriate impedance being connected thereto. This helps to avoid selecting a large core size.

A similar effect can be obtained by connecting, instead of a tertiary winding, an appropriate impedance to the secondary winding 103 or 202.

When the above-mentioned VATROVAC-6025F by Vacuumschmelze GmbH which is a cobalt based amorphous alloy is employed as the material of the cores 100 and 200 in the construction shown in FIG. 2, an S/N ratio of ca. 120 dB can be obtained with ease.

Thus an economical, compact and lightweight signal discriminator having a simple structure and providing a high S/N ratio can be realized.

Said cobalt based amorphous alloy is composed of cobalt (Co), iron (Fe), silicon (Si), boron (B), molybdenum (Mo), and nickel (Ni) and can be formulated as:

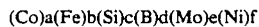

$$(Co)_a(Fe)_b(Si)_c(B)_d(Mo)_e(Ni)_f$$

where a to f represent the atomic percentage of the component elements. Here, a=50 to 90, b=1 to 10, c=5 to 20, d=0 to 20, e=0 to 20, and f=1 to 5, the sum of a through f being 100.

The cores 100 and 200 consist of toroidal cores with, for example, a ring-like configuration, each formed by winding a number of times a ribbon made of a cobalt based amorphous alloy. After being formed as rings, these toroidal cores of an amorphous alloy in the cobalt family are provided with a desired magnetic permeability by a heat treatment under a temperature of 150 to 450 degrees C. for 5 to 180 minutes. It is desirable that the heat treatment should be effected in a D.C. or A.C. magnetic field so that a uniform performance may be obtained. A more stable performance will be attained by conducting the heat treatment in a nitrogen atmosphere.

As described above, the first type of signal discriminator of this invention makes it possible, with a simple structure, to obtain a detection signal having a high S/N ratio and electrically insulated from the principal circuit when the principal circuit current is composed of two or more superimposed current components with different frequencies. Furthermore, it can be realized as an economical, compact and lightweight signal discriminator.

Figure 5:
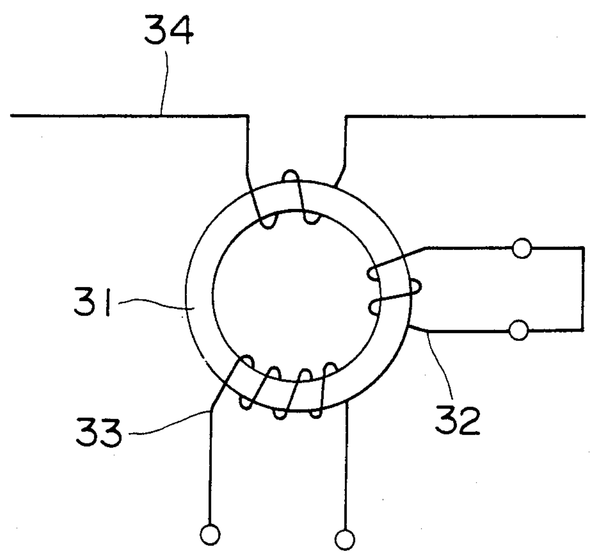
FIG. 5 is a schematic side view illustrating the principle of a second embodiment of the present invention.

The second type of signal discriminator in accordance with this invention will now be described along with a signal discrimination method using this signal discriminator with reference to FIG. 5 illustrating the principle thereof.

This signal discriminator includes a first winding 32 and a second winding 33 wound on an annular core 31. It further includes a signal line 34 wound on this annular core 31 to form a first coil. The first and second windings 32 and 33 act as a second coil with respect to this first coil.

A low frequency current and a high frequency current flow through the signal line 34, thereby generating a magnetomotive force in the annular core 31. This causes an electromotive force to be generated in the first and second windings 32 and 33. Since the ends of the first winding 32 are short-circuited, a current which cancels the change in magnetic flux in the annular core 31 flows through the first winding 32.

The annular core 31 has a high magnetic permeability which is approximately constant from the low frequency region to the high frequency region, the residual magnetism and coercive force thereof both being small. Further, it has an approximately linear BH characteristic with its magnetomotive force and the magnetic density being roughly proportional to each other. Consequently, the value of inductive reactance in the first winding 32 is small for a low frequency and large for a high frequency.

This causes the low frequency component to be cancelled, allowing the high frequency component to be exclusively obtained from the second winding 33.

Figure 6:
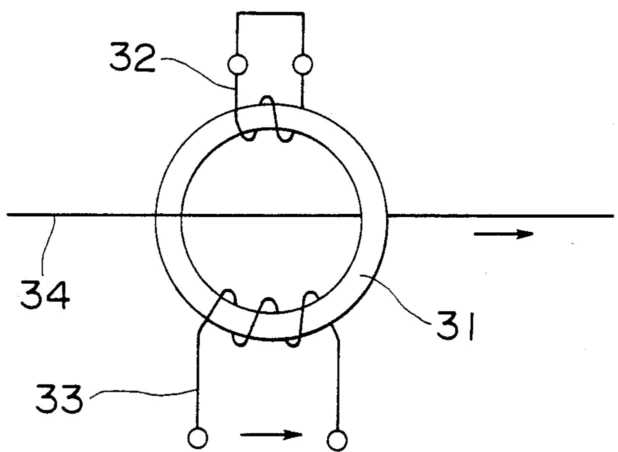
FIG. 6 is a side view illustrating a signal discriminator in accordance with the second embodiment of the present invention.

In practice, it is not necessary to wind the signal line 34 on the core as in FIG. 5; it suffices to pass it through the annular core 31 as shown in FIG. 6.

As for the material of the annular core 31, an amorphous alloy containing cobalt as the main component may be mentioned as an example. However, other types of magnetic material may be employed.

When a cobalt based amorphous alloy is to be employed as the material of the annular core 31, the same thing as shown previously as the material of the core in the first type of signal discriminator may be utilized. The manufacturing method thereof may also follow that of the first type of signal discriminator.

Figure 8:
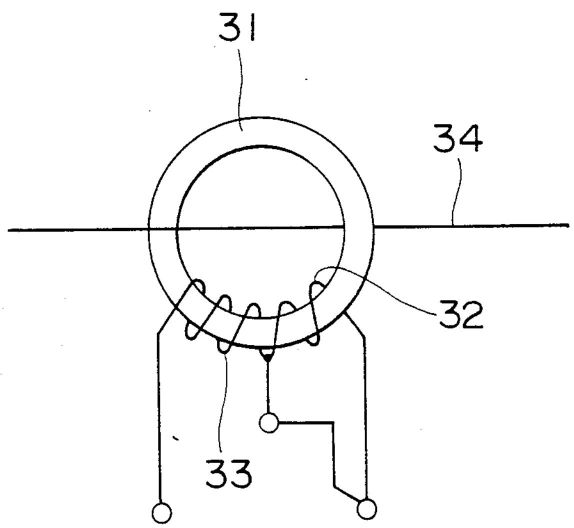
FIG. 8 is a schematic view showing another embodiment of the signal discriminator.

Although the first and second windings 32 and 33 may be separately wound, they may share a part thereof as shown in FIG. 8.

The second type of signal discriminator in accordance with this invention and a signal discrimination method by this signal discriminator will now be described more specifically with reference to FIGS. 5 to 12.

The annular core 31 is formed by winding a ribbon of VATROVAC-6025F manufactured by Vacuumschmelze GmbH for example into an annular form. As shown in FIG. 6, the first winding 32 the ends of which are short-circuited and the second winding 33 the ends of which are opened are wound on this annular core 31.

Figure 7A:
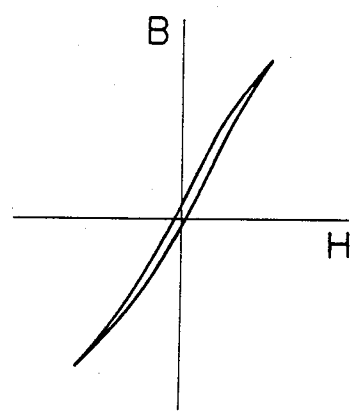
FIG. 7A is a graph showing the B-H characteristic of the magnetic material employed for the annular core.

Said annular core 31 may have a width of 10 mm, an inner diameter of 150 mm and a height of 3 mm. The number of turns of said first winding 32 may be three and that of said second winding 33 ten, the characteristic curve of the core being approximately linear, as shown in FIG. 7A.

The size of this core 31 may vary according to the line to which it is applied, the requisite sensitivity, etc. When it is to be attached to a grounding, the inner diameter thereof may be as small as ca. 30 mm.

When using the signal discriminator having the above-described structure, the signal line 34 is inserted into the annular core 31, and the high frequency component of the principal circuit current $i_1$ flowing through this signal detection line 34 is detected.

Suppose the principal circuit current $i_1$ is composed of a high frequency current $i_H$ and a low frequency current $i_L$, one superimposed on the other, the operation of discriminating the signal due to the high frequency current $i_H$ out of the principal circuit current $i_1$ may be mathematically described as follows:

First, the principal circuit current may be expressed as:

$$i_1 = i_L \sin(2\pi ft + \phi_o) + i_H \sin(2\pi f_n t + \phi_n)$$

Figure 7B:
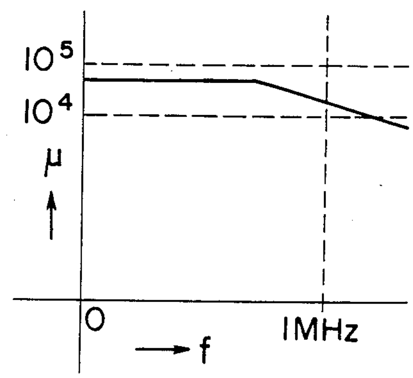
FIG. 7B is a graph showing the frequency characteristic of the magnetic material employed for the annular core.

Since the magnetic permeability of the annular core 31 is approximately constant from the low frequency region to the high frequency region, as shown in FIG. 7B, the inductance with respect to f which is the frequency of the low frequency current and the inductance with respect to $f_n$ which is the frequency of the high frequency current are approximately equal to each other. The value of this inductance will be referred to as L.

The induction reactance $X_L$ for the frequency f of the first winding 32 may then be expressed as:

$$X_L = 2\pi f.L$$

and the induction reactance $X_H$ for the frequency f may be expressed as:

$$X_H = 2\pi f_n.L$$

The internal voltage with the frequency f generated in the first winding 32 is roughly proportional to the inductive reactance $X_L$, and the internal voltage with the frequency $f_n$ is roughly proportional to the inductive reactance $X_H$. Further, the voltage generated in the second winding 33 is roughly proportional to the internal voltage generated in the first winding 32, so that when $$f_n/f = n,$$

$$X_H/X_L = n$$

Accordingly, when $f_n/f = n = 10^5$, for example, it is possible to obtain the high frequency component with the frequency $f_n$ from the second winding 33 by reducing the low frequency component with the frequency f to ca. 100 dB with respect to the high frequency component with the frequency $f_n$.

Figure 7C:
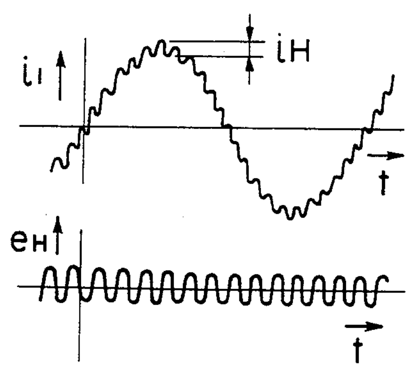
FIG. 7C is a graph showing the relation between the waveform of the signal to be detected and the high frequency component discriminated from this waveform.
Figure 7D:
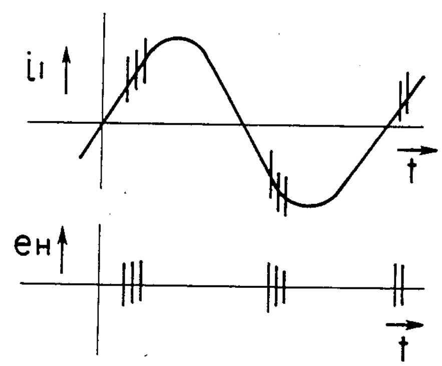
FIG. 7D is a graph showing the relation between the waveform of the signal to be detected which is to be represented as a sine wave with a pulse superimposed thereon and the pulse component discriminated from this waveform.

FIG. 7C shows the relation between the principal circuit current $i_1$ which in this case is a signal composed of a high frequency current $i_H$ superimposed on a sine wave and a detection signal voltage $e_H$ discriminated, on a time axis basis. FIG. 7D shows the detection signal voltage $e_H$ when a pulse is superimposed on the principal circuit current $i_1$ which is a sine wave.

Figure 9:
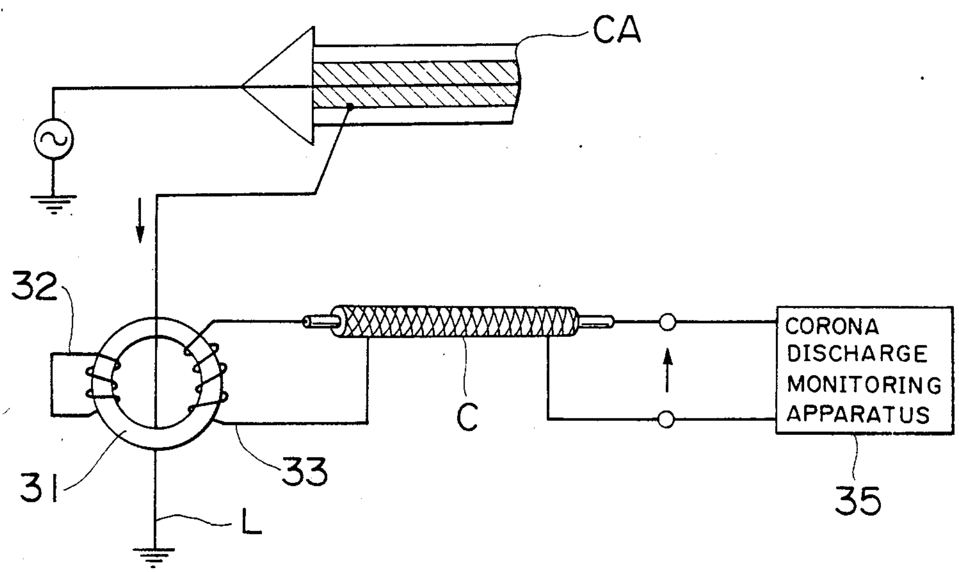
FIG. 9 is a schematic view of an apparatus for detecting deterioration in insulation of a power cable using a signal discriminator.

FIG. 9 illustrates the above described signal discrimination method as applied to a supervisory system for checking any deterioration in insulation of a high-tension cable CA. When in this example the principal circuit current $i_1$ is such as is obtained by combining the dominant wave of a charging and a leakage current of the insulator and a low frequency current $i_E$ which is the high frequency component thereof with a corona discharge current which is the deterioration signal for the insulator, a partial discharge current, or a high frequency current $i_P$ which is due to a kick-like pulse current, the secondary winding 33 has a high inductive reactance to a high frequency current and a low inductive reactance to a low frequency current, so that the change in magnetic flux due to the low frequency current in the annular core 31 is cancelled.

On the other hand, the change in magnetic flux due to the high frequency current is retained, so that a high frequency pulse voltage signal due to the deterioration signal for the insulator can be obtained at the secondary winding 33, which is transmitted to a corona discharge monitoring device 5 installed in a distance through a coaxial cable C with a balanced impedance for the purpose of detecting any deterioration in insulation of the cable CA.

Figure 10:
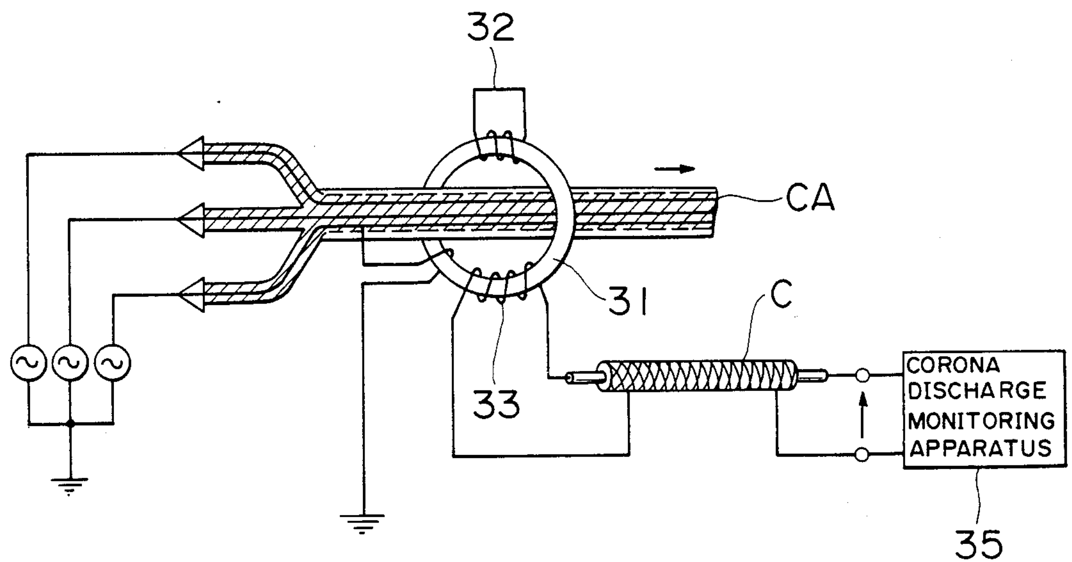
FIG. 10 is a schematic view showing another construction of an apparatus for detecting deterioration in insulation of a power cable using a signal discriminator.

In the apparatus shown in FIG. 10, which also serves to detect any deterioration in the cable CA, the high-tension cable CA also serves as the signal line 34. This arrangement makes it possible to detect not only deterioration in the insulator of the cable CA but also deterioration in insulation of the apparatuses connected to the cable CA.

Figure 11A:
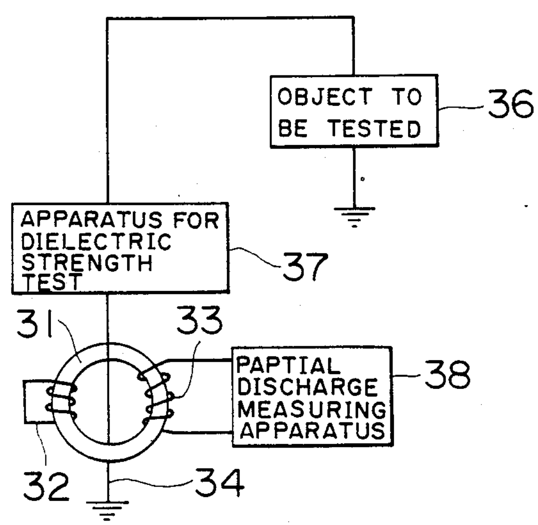
FIGS. 11A and 11B are block diagrams showing the above construction as applied to insulating strength test circuits.
Figure 11B:
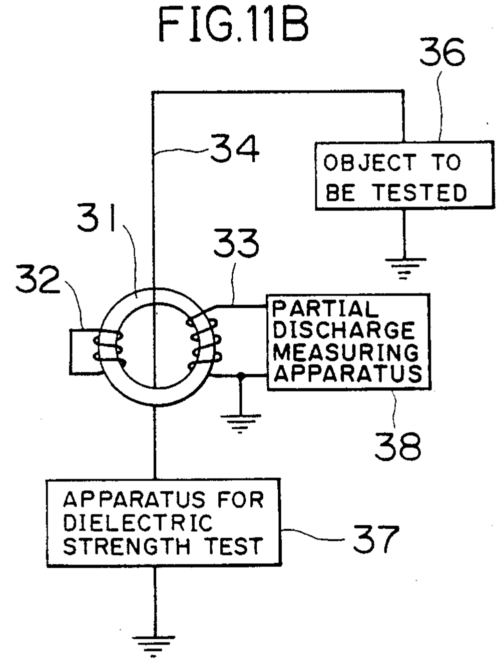

FIGS. 11A and 11B show the signal discrimination method in accordance with this invention as applied to an apparatus for conducting insulating strength tests with DC or AC high voltage. By thus using the discrimination method in accordance with this invention, combining an apparatus for insulating strength tests 37 and a partial discharge measuring apparatus 38, any deterioration in the insulator of an object 36 to be tested can be continuously detected, which makes it possible to detect threats of dielectric breakdown in the object 36 to be tested before it actually takes place, thereby preventing the object 36 from being broken.

Figure 12A:
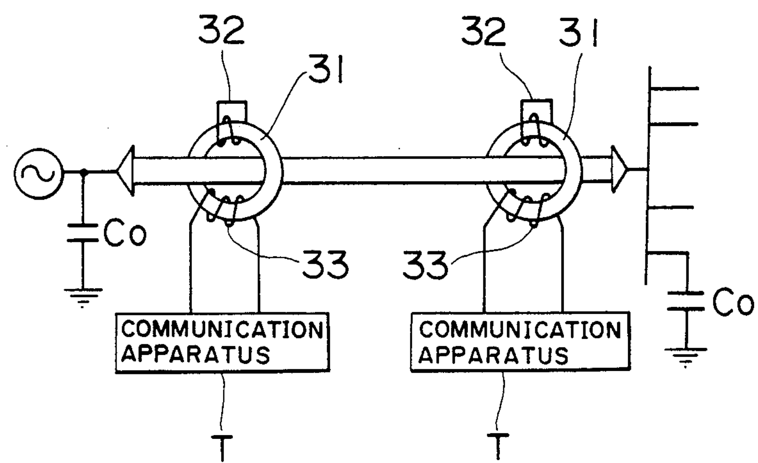
FIGS. 12A and 12B are block diagrams showing the above construction as applied to a communication apparatus T utilizing a power line.
Figure 12B:
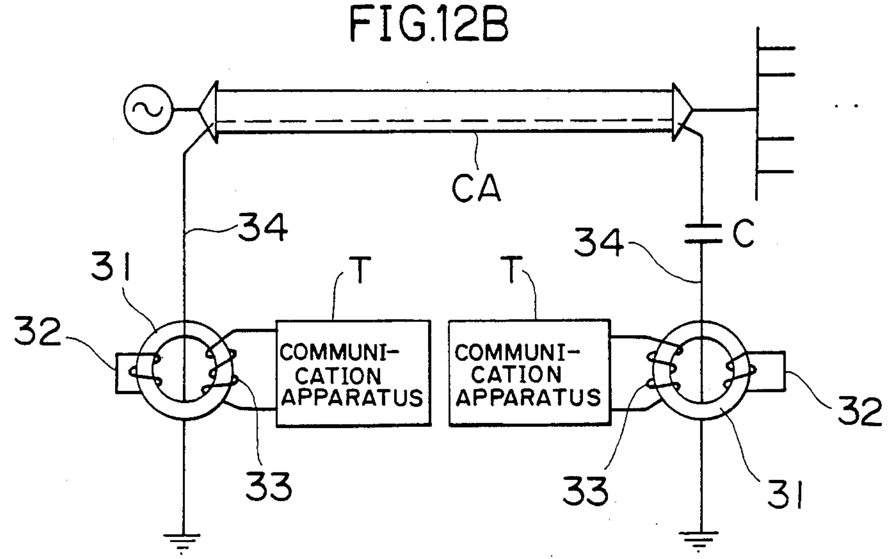

FIGS. 12A and 12B show the discrimination method of this invention as applied to a communication apparatus T using a power line. In the apparatus shown in FIG. 12A, the communiction line is formed by utilizing the electrostatic capacity to ground $C_o$ of the system and the shielding wire of the power line. By thus using the discrimination method of this invention, it becomes unnecessary to provide an additional communication line, a feature suited for local communication in construction sites, etc.

The apparatus in accordance with this invention is composed of a first winding 32 and a second winding 33 with a greater turn ratio than that of this first winding 32, both windings provided on an annular core 31 which has an approximately linear BH-characteristic, the magnetomotive force thereof being roughly proportional to the magnetic flux density, and whose magnetic permeability is approximately constant from the low frequency region to the high frequency region. Due to the above construction, this apparatus makes it possible to detect exclusively the high frequency component from the secondary winding 33.

Accordingly, it does not require a filter with high accuracy as the conventional apparatuses, so that it can be a compact and lightweight apparatus that can be manufactured at low cost. Furthermore, there is no fear of the phase of the high frequency component being reversed. The S/N ratio and the sensitivity that it provides are also satisfactory. Moreover, it provides a satisfactory isolation, so that it can be safely attached to a high-tension hot-line.

What is claimed is:

1. A signal discriminator composed of a first winding with short-circuited ends and a second winding for detecting signals, said first and second windings and being wound on an annular core having an approximately linear BH characteristic with magnetomotive force and magnetic flux density roughly proportional to each other.

2. A signal discriminator as claimed in claim 1, wherein said annular core is formed from an amorphous metal containing cobalt as the main component.

3. A signal discriminator comprising: a first coil composed of first and second primary windings wound with the same number of turns and in the same direction, each of said primary windings having a winding start terminal and a winding end terminal, and a secondary winding having terminals, said first and second primary windings and said secondary winding being provided on a core whose magnetomotive force and magnetic flux density are roughly proportional to each other;

a second coil composed of a primary winding having terminals and a secondary winding having terminals wound on a core whose magnetomotive force and magnetic flux density are roughly proportional to each other; and an impedance circuit;

the terminals of said primary winding in the second coil being respectively connected to said winding end terminals of said first and second primary windings in the first coil, the impedance circuit being connected to said winding end terminal of said first primary winding and said winding start terminal of said second primary winding in the first coil, detection signals with discriminated frequencies being obtained respectively from the terminals of said secondary winding in the first coil and the terminals of said secondary winding in the second coil when an electric current composed of more than two superimposed current components with different frequencies flows between the winding start terminals of said primary windings in the firs coil.

4. A signal discriminator as claimed in claim 3, wherein the cores of said first and second coils are formed from an amorphous alloy containing cobalt as the main component.

5. A method of discriminating signals comprising the steps of: short-circuiting ends of a first winding wound on an annular core; detecting signals on said annular core by means of a second winding wound on said annular core, said annular core having an approximately linear BH characteristic with a magnetomotive force and the magnetic flux density roughly proportional to each other as well as a high magnetic permeability which is constant from a low frequency region to a high frequency region; sending combined currents of low and high frequencies to a signal line which passes through said annular core; and obtaining a high frequency component from said second winding where a low frequency component is cancelled by a characteristic of an inductive reactance of said first winding with short-circuited ends.

* * * * *

UNITED STATES PATENT AND TRADEMARK OFFICE
CERTIFICATE OF CORRECTION

PATENT NO. : 4,897,561

DATED : January 30, 1990

INVENTOR(S) : Akira Saigo, et al.

It is certified that error appears in the above-identified patent and that said Letters Patent is hereby corrected as shown below:

Claim 3, second to last line, delete "firs", insert --first--.

Signed and Sealed this

Twenty-first Day of May, 1991

*Attest:*

HARRY F. MANBECK, JR.

*Attesting Officer*

*Commissioner of Patents and Trademarks*